(12) United States Patent
Seyama

(10) Patent No.: US 10,477,697 B2
(45) Date of Patent: Nov. 12, 2019

(54) MOUNTING APPARATUS

(71) Applicant: Shinkawa Ltd., Tokyo (JP)

(72) Inventor: Kohei Seyama, Tokyo (JP)

(73) Assignee: SHINKAWA LTD., Tokyo (JP)

(*) Notice: Subject to any disclaimer, the term of this patent is extended or adjusted under 35 U.S.C. 154(b) by 210 days.

(21) Appl. No.: 15/396,997

(22) Filed: Jan. 3, 2017

(65) Prior Publication Data

US 2017/0118843 A1    Apr. 27, 2017

Related U.S. Application Data

(63) Continuation of application No. PCT/JP2014/076153, filed on Sep. 30, 2014.

(30) Foreign Application Priority Data

Jul. 2, 2014 (JP) .................................. 2014-136701

(51) Int. Cl.
*H05K 3/30* (2006.01)
*H01L 21/67* (2006.01)
(Continued)

(52) U.S. Cl.
CPC ......... *H05K 3/30* (2013.01); *H01L 21/67132* (2013.01); *H01L 21/67144* (2013.01);
(Continued)

(58) Field of Classification Search
CPC ... H01L 24/81; H01L 24/83; H01L 21/67132; H05K 3/30
See application file for complete search history.

(56) References Cited

U.S. PATENT DOCUMENTS 7,703,656 B2 * 4/2010 Park .................. B23K 20/1255
228/112.1
2002/0189767 A1 12/2002 Yamauchi
(Continued)

FOREIGN PATENT DOCUMENTS

JP 2001-332586 A 11/2001
JP 2004-221184 A 8/2004
(Continued)

OTHER PUBLICATIONS

International Search Report dated Nov. 11, 2014, from corresponding International Application No. PCT/JP2014/076153.
(Continued)

*Primary Examiner* — Minh N Trinh
(74) *Attorney, Agent, or Firm* — Katten Muchin Rosenman LLP

(57) ABSTRACT

A mounting apparatus includes a Y-axis movable base 36 movable in a Y-axis direction, a Z-axis movable base 40 attached to the Y-axis movable base 36 and movable in a Z-axis direction, a mounting head 12 attached to the Z-axis movable base 40 and including a mounting tool 16 for sucking and holding a semiconductor chip, a pressurizing mechanism 20 attached to the Y-axis movable base 36 and arranged to apply a force in the Z-axis direction to the mounting head 12, and a pressure receiving member 22 provided independently of the Y-axis and Z-axis movable bases 36 and 40 and installed in proximity to the pressurizing mechanism 20 to receive a reaction force in the Z-axis direction from the pressurizing mechanism 20, the pressurizing mechanism 20 slidable on the pressure receiving member 22. This prevents the mounting apparatus from being increased in the total size while maintaining the mounting accuracy high.

6 Claims, 3 Drawing Sheets

(51) Int. Cl.
  *H01L 23/00* (2006.01)
  *H05K 13/04* (2006.01)

(52) U.S. Cl.
  CPC ........... *H01L 24/75* (2013.01); *H05K 13/046* (2013.01); *H05K 13/0413* (2013.01); *H01L 24/81* (2013.01); *H01L 24/83* (2013.01); *H01L 2224/753* (2013.01); *H01L 2224/759* (2013.01); *H01L 2224/75745* (2013.01); *H01L 2224/75824* (2013.01)

(56) References Cited

U.S. PATENT DOCUMENTS

2004/0074944 A1* 4/2004 Okamoto ............. B23K 20/122
                                                    228/2.1
2014/0144972 A1* 5/2014 Takasugi ............ B23K 20/1255
                                                    228/112.1
2017/0118843 A1* 4/2017 Seyama ............ H01L 21/67132

FOREIGN PATENT DOCUMENTS

| | | |
|---|---|---|
| JP | 2007-221098 A | 8/2007 |
| JP | 2009-027105 A | 2/2009 |
| JP | 4592637 B2 | 9/2010 |
| JP | 4644481 B2 | 12/2010 |
| JP | 5252516 B2 | 4/2013 |
| WO | 01/041209 A1 | 6/2001 |

OTHER PUBLICATIONS

International Preliminary Report on Patentability dated Jan. 3, 2017, from corresponding International Application No. PCT/JP2014/076153.

* cited by examiner

MOUNTING APPARATUS

TECHNICAL FIELD

The present invention relates to a mounting apparatus for mounting an electronic component such as a semiconductor chip on a substrate.

BACKGROUND ART

Conventional mounting apparatuses have been widely known that are arranged to transfer to a position over a substrate an electronic component such as a semiconductor chip being sucked and held with a mounting tool and then mount the electronic component on the substrate.

Among such mounting apparatuses, not the substrate but the mounting head with the mounting tool may be moved to locate the mounting tool immediately above a mounting position on the substrate. For example, in Patent Document 1, a horizontally movable body is attached to a horizontal guide rail extending in a horizontal direction, and a guide rail for guiding a mounting head in a vertical direction and a pressurizing mechanism (e.g. motor) for applying a vertical force to the mounting head are attached to the horizontally movable body.

In general, the substrate stage for holding a substrate thereon, which also has, for example, a heating mechanism for heating the entire substrate, is often larger than the mounting head. Arranging such that not the substrate stage but the mounting head is moved allows for reduction in the size and/or cost of the entire apparatus, for example.

CITATION LIST

Patent Documents

Patent Document 1: Japanese Patent No. 4644481
Patent Document 2: Japanese Patent No. 4592637
Patent Document 3: Japanese Unexamined Patent Application Publication No. 2001-332586
Patent Document 4: Japanese Unexamined Patent Application Publication No. 2009-27105
Patent Document 5: Japanese Patent No. 5252516

SUMMARY OF THE INVENTION

Technical Problem

However, in the arrangement of Patent Document 1 in which the pressurizing mechanism is attached to the horizontally movable body, the horizontally movable body and even the mounting head attached to the horizontally movable body may be inclined with respect to the horizontal axis, resulting in giving rise to poor mounting accuracy.

That is, upon usage, the mounting tool presses the substrate and necessarily experiences a vertical reaction force. In the arrangement of Patent Document 1, the pressurizing mechanism attached to the horizontally movable body receives the reaction force. However, due to space limitations, the pressurizing mechanism is arranged in an offset manner with respect to the horizontal guide rail and held in a cantilever manner. When the pressurizing mechanism receives the vertical reaction force, a moment occurs, and the pressurizing mechanism and even the vertically movable body to which the pressurizing mechanism is attached and/or the mounting head are possibly inclined with respect to the vertical axis.

Patent Documents 2 to 5 disclose a separation pressurizing mechanism in which a pressurizing mechanism for pressurizing a mounting head in a vertical direction is attached to a structure different from a structure to which the mounting head is attached. In accordance with the separation pressurizing mechanism, since the mounting head and the pressurizing mechanism are separated from each other, the inclination, for example, of the pressurizing mechanism, though receiving a reaction force of the mounting head, is not transmitted to the mounting head, which makes it possible to maintain the posture of the mounting head normal and therefore the mounting accuracy high.

However, in all of the techniques disclosed in Patent Documents 2 to 5, the pressurizing mechanism is attached to a fixed member, so that the position of the pressurizing mechanism is approximately fixed. It is therefore necessary to move the substrate to a position immediately below the pressurizing mechanism when mounting an electronic component on the substrate using the mounting tool. Moving the substrate stage, which is larger than the mounting head, gives rise to a new problem of increased size and/or cost of the entire mounting apparatus.

It is hence an object of the present invention to provide a mounting apparatus prevented from being increased in the total size while maintaining the mounting accuracy high.

Solution to Problem

The present invention is directed to a mounting apparatus for mounting an electronic component on a substrate, including a first movable base movable in a specified first direction, a second movable base attached to the first movable base and movable in a second direction orthogonal to the first direction, a mounting head attached to the second movable base and including a mounting tool for sucking and holding the electronic component, a pressurizing mechanism attached to the first movable base and arranged to apply a force in the second direction to the mounting head, and a pressure receiving member provided independently of the first movable base and the second movable base and installed in proximity to the pressurizing mechanism to receive a reaction force in the second direction from the pressurizing mechanism, the pressurizing mechanism slidable on the pressure receiving member.

In a preferred aspect, the pressurizing mechanism is attached to the first movable base in a manner allowed to move in the second direction while held against the force of gravity. In this case, the pressurizing mechanism is preferably attached to the first movable base via an elastic body flexible in the second direction upon receipt of a reaction force while holding the pressurizing mechanism against the force of gravity.

In another preferred aspect, the pressure receiving member has a size that entirely covers a movable range of the second movable base. In a further preferred aspect, the first movable base is arranged to move along a first rail extending in the first direction, and the first rail and the pressure receiving member are attached to a third movable base movable in a third direction orthogonal to the first direction and the second direction.

Advantageous Effects of the Invention

In accordance with the present invention, since the pressure receiving member, which is provided independently of the first movable base and the second movable base, is arranged to receive a reaction force, it is possible to prevent the mounting head from being inclined due to the reaction force and thereby to prevent the mounting accuracy from decreasing. Further, in accordance with the present invention, since the pressurizing mechanism is movable in a horizontal direction together with the mounting head, there is no need to provide a moving mechanism for the substrate, whereby it is possible to prevent the size of the entire apparatus from being increased.

DETAILED DESCRIPTION OF THE INVENTION

Figure 1:
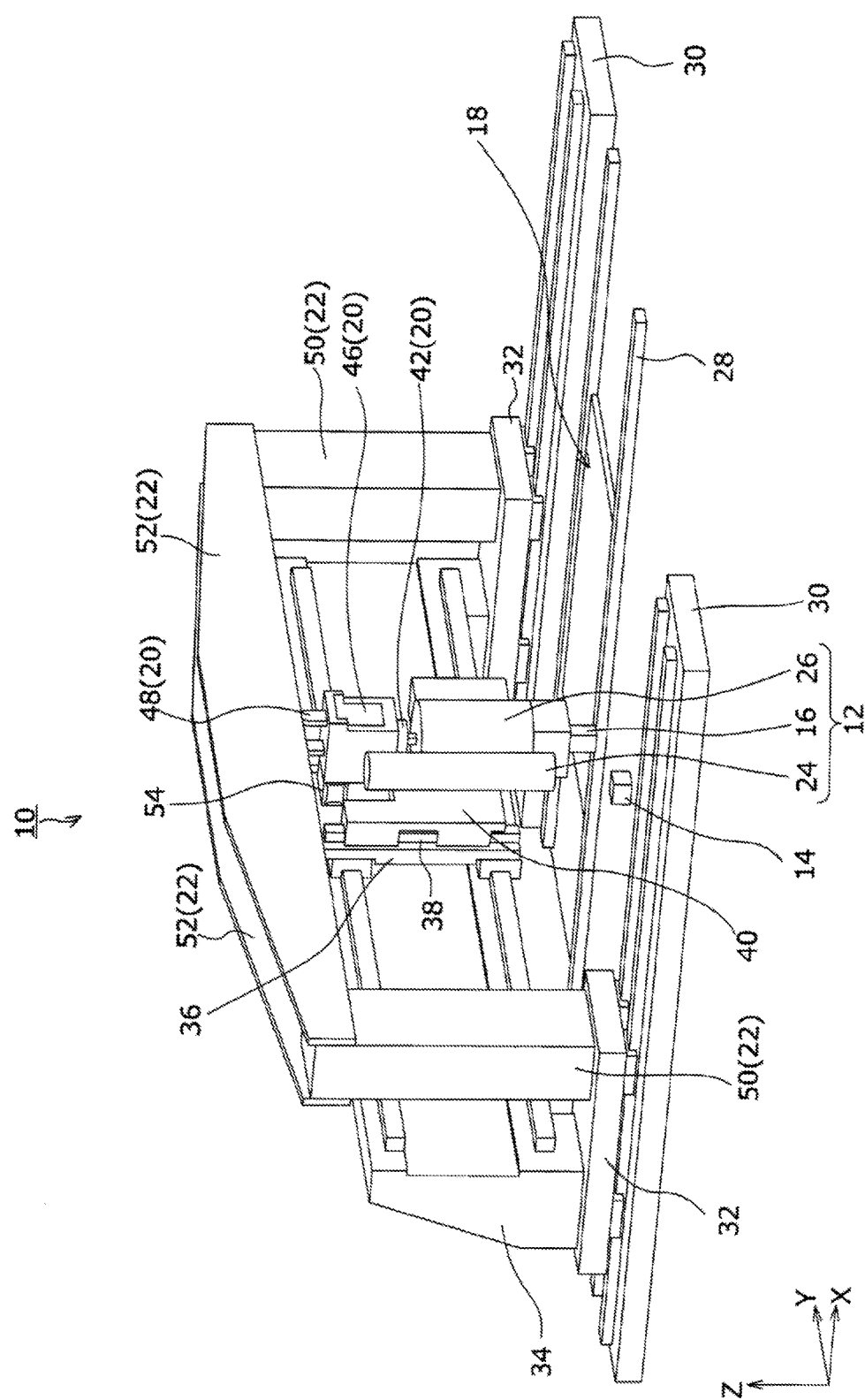
FIG. 1 is a perspective view of a substantial part of a mounting apparatus according to an embodiment of the present invention.
Figure 2:
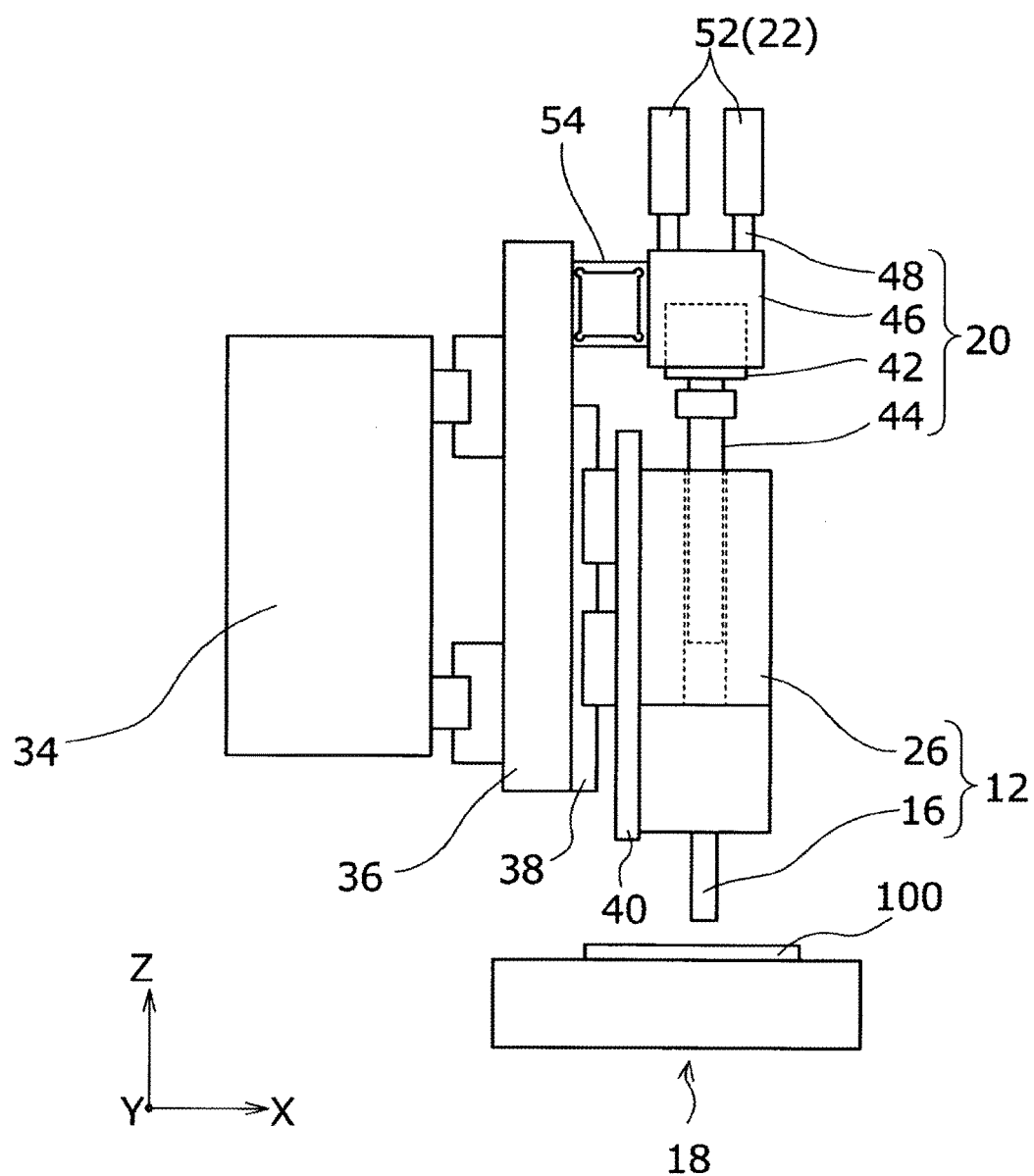
FIG. 2 is a schematic side view around a mounting head.

An embodiment of the present invention will hereinafter be described with reference to the drawings. FIG. 1 is a perspective view of a substantial part of a mounting apparatus 10 according to the embodiment of the present invention. Also, FIG. 2 is a schematic side view around a mounting head 12. It is noted that for clear understanding of the invention, a material supplying unit in which a wafer is to be installed and a material feeding unit for carrying an electronic component from the material supplying unit to a relay stage 14 are not shown in FIG. 1.

The mounting apparatus 10 is, for example, a flip-chip mounting apparatus for mounting a semiconductor chip as an electronic component on a substrate 100 in a downward facing manner. The mounting apparatus 10 includes the mounting head 12 including a mounting tool 16, chip supplying means (not shown) for supplying the semiconductor chip to the mounting tool 16, a substrate stage 18 on which the substrate 100 is placed, a head moving mechanism for moving the mounting head 12 in an XY direction (in a horizontal direction), a pressurizing mechanism 20 for pressurizing the mounting head 12 in a vertical direction, and a pressure receiving member 22 for receiving a reaction force from the mounting head 12.

The semiconductor chip is transferred with a relay arm (not shown) provided in the chip supplying means from the wafer to the relay stage 14. The semiconductor chip placed on the relay stage 14 is picked up with the mounting tool 16, and then transferred to a position over the substrate 100 and mounted on the substrate 100. The mounting head 12 is provided with the mounting tool 16 for sucking and holding the semiconductor chip as well as a rotating mechanism (not shown) for the mounting tool 16, a camera 24, etc. The rotating mechanism is arranged to rotate the mounting tool 16 around a vertical axis in response to an instruction from a control unit (not shown) of the mounting apparatus 10. The camera 24 is arranged to image the semiconductor chip to be picked up and/or the surface of the substrate 100 as appropriate. The control unit of the mounting apparatus 10 is arranged to adjust the position and/or posture of the mounting tool 16 appropriately according to an image taken by the camera 24.

The substrate stage 18 for holding the substrate 100 thereon is provided at a position opposed to the mounting tool 16. The substrate stage 18 is provided with, for example, a transport mechanism 28 for transporting the substrate 100 in an X direction to carry-in/eject the substrate 100 and a heater for heating the substrate 100.

The mounting head 12 is made movable in the XY direction by the head moving mechanism. The head moving mechanism, which can have any one of various configurations, employs an XY gantry-type moving mechanism in this embodiment. Specifically, the head moving mechanism of this embodiment includes a pair of X-axis guide rails 30 installed on a base surface, that is, a horizontal surface of a fixed member and extending in the X direction. An X-axis movable base 32 arranged to move along the X-axis guide rails 30 in response to driving of an X-axis motor (not shown) is attached to the X-axis guide rails 30. On the X-axis movable base 32, there are installed a Y-axis guide rail 34 bridged between the pair of X-axis guide rails 30 and the pressure receiving member 22. Further, a Y-axis movable base 36 arranged to move along the Y-axis guide rail 34 in response to driving of a Y-axis motor (not shown) is attached to the front surface of the Y-axis guide rail 34. The Y-axis movable base 36 is a flat plate having an approximately rectangular shape, to the front surface of which a Z-axis guide rail 38 is attached. The Z-axis guide rail 38 is attached to the front surface of the Y-axis movable base 36 and extends in the Z-axis direction. A Z-axis movable base 40 arranged to move up and down along the Z-axis guide rail 38 is attached to the Z-axis guide rail 38, with the mounting head 12 being fixed on the front surface of the Z-axis movable base 40.

Further, the pressurizing mechanism 20 is also attached to the front surface of the Y-axis movable base 36. The pressurizing mechanism 20 is arranged to apply a vertical force to the mounting head 12 and constituted by a Z-axis motor 42, a lead screw 44 coupled to the Z-axis motor 42, a motor holder 46 holding the Z-axis motor 42, etc. The lead screw 44 is screwed into a movable block 26 provided in the mounting head 12 and the movable block 26 is arranged to move up and down in response to driving of the Z-axis motor 42 and therefore the rotation of the lead screw 44. Further, the force of the up-and-down movement is utilized also as a pressurizing force for pressing the semiconductor chip held with the mounting tool 16 onto the substrate 100. That is, the pressurizing mechanism 20 functions as a Z-axis moving mechanism for up-and-down movement of the mounting head 12 and also as pressuring means for applying a vertical force to the mounting tool 16.

Here, if the pressurizing mechanism 20 were only fixed to the Y-axis movable base 36 via a bracket or the like made of, for example, metal, a problem would occur that the pressurizing mechanism 20 receives a reaction force from the mounting head 12 and experiences a moment, so that the pressurizing mechanism 20 and/or the Y-axis movable base 36 coupled to the pressurizing mechanism 20 are inclined, resulting in poor mounting accuracy.

That is, the pressurizing mechanism 20, if only fixed to the front surface of the Y-axis movable base 36, would generally be held in a cantilever manner. In contrast, in the flip-chip mounting, a relatively high load of, for example, 200 to 300 N (about 20 to 30 kgf) is used to press the semiconductor chip against the substrate 100. In this case, the mounting tool 16 naturally experiences a reaction force of a magnitude according to the load, and the reaction force is transmitted to the pressurizing mechanism 20, which presses the mounting tool 16. If the pressurizing mechanism 20 were only held in a cantilever manner, such a reaction force could cause a moment to occur on the pressurizing mechanism 20 and the pressurizing mechanism 20 and even the Y-axis movable base 36 to which pressurizing mechanism 20 is attached and/or the mounting head 12 attached to the Y-axis base to be inclined with respect to the vertical axis. Such an inclination of the mounting head 12 could result in poor mounting accuracy.

To avoid such a problem, the pressurizing mechanism 20 may not be attached to the Y-axis movable base 36, but may be fixed to another fixed member. In this case, however, the position of the pressurizing mechanism 20 would be fixed and the position of the up-and-down movement of the mounting tool 16 would also be fixed. In this case, it would become necessary to provide an XY moving mechanism not for the mounting head but for the substrate to change the relative positional relationship between the mounting tool 16 and the substrate 100. However, moving the substrate 100, which is often larger than the mounting head 12, would give rise to a new problem of, for example, increased size and/or cost of the moving mechanism.

Hence, in this embodiment, to avoid such a problem, the pressurizing mechanism 20 is attached to the Y-axis movable base 36 to be movable and the pressure receiving member 22 is provided to receive a reaction from the mounting head 12.

The pressure receiving member 22 is a portal member constituted by a pair of columns 50 standing on the X-axis movable base 32 and a pressure receiving plate 52 bridged between the pair of columns 50. The pressure receiving member 22, which is attached to the X-axis movable base 32, is moved together with the mounting head 12 and the pressurizing members in the X-axis direction, and the pressure receiving plate 52 of the pressure receiving member 22 is always located over the pressurizing mechanism 20.

On the upper surface of the motor holder 46, a contact member 48 is provided that is in contact with the bottom surface of the pressure receiving plate 52 and slidable with respect to the pressure receiving plate 52. In this embodiment, two boards each having an arc-shaped leading end are provided as the contact member 48, though the configurations and the like thereof are not particularly limited as long as it is slidable with respect to the pressure receiving plate 52 (pressure receiving member 22). Since the contact member 48 comes into contact with the pressure receiving plate 52 at only one arc point, it is possible to keep the sliding friction low.

A reaction force that occurs when the mounting tool 16 is used to press the semiconductor chip against the surface of the substrate 100 is transmitted via the mounting tool 16, the pressurizing mechanism 20, and the contact member 48 to the pressure receiving plate 52. The pressure receiving plate 52, which is a member provided independently of the pressurizing mechanism 20, the Y-axis movable base 36, and the mounting head 12, cannot affect, even if may be inclined upon receiving a reaction force, the pressurizing mechanism 20 and/or the mounting head 12. Thus providing the pressure receiving plate 52 prevents the pressurizing mechanism 20 and/or the mounting head 12 from being inclined upon receiving a reaction force and thereby the mounting accuracy from decreasing.

Also, in this embodiment, the pressurizing mechanism 20 is attached to the Y-axis movable base 36 and made movable together with the mounting head 12 in the horizontal direction. This allows the mounting tool 16 to move up and down anywhere within a horizontal movable range of the mounting head 12. As a result, there is no need to provide a highly accurate moving mechanism for the substrate 100 to change the relative position between the mounting tool 16 and the substrate 100, which allows for reduction in the size and/or cost of the entire apparatus. It is noted that the pressure receiving member 22 has a size and configuration that is able to cover a horizontal movable range of the pressurizing mechanism 20 entirely so as to be capable of reliably receiving the reaction force wherever the mounting tool 16 is pressed against the surface of the substrate 100.

Incidentally, if the pressurizing mechanism 20 is fixed tightly to the Y-axis movable base 36, the reaction force is not transmitted to the pressure receiving member 22, even if may be provided, and a moment occurs on the pressurizing mechanism 20 to result in that the pressurizing mechanism 20 and/or the mounting head 12 may be inclined. Hence, in this embodiment, the pressurizing mechanism 20 is attached to the Y-axis movable base 36 in a manner allowed to move in the vertical direction. Specifically, in this embodiment, the pressurizing mechanism 20 is attached to the Y-axis movable base 36 via an elastic body 54. The elastic body 54 has a spring hardness capable of holding the pressurizing mechanism 20 against the force of gravity, while of displacing the pressurizing mechanism 20 in the vertical direction when receiving a force of a certain magnitude (e.g. equal to or greater than the force of gravity). The elastic body 54, which may have any one of various configurations, employs a hollow box-shaped elastic body with the left and right side plates bored into an approximately rectangular shape in this embodiment. The thus arranged elastic body 54 is flexible in the vertical direction in relation to the boring into an approximately rectangular shape, while less flexible in the horizontal direction because the bottom plate and the top plate are not bored (or only slightly bored). Attaching the Z-axis motor 42 to the Y-axis movable base 36 via the thus arranged elastic body 54 causes the pressurizing mechanism 20 to be held against the force of gravity, while to move in the Z-axis direction, when receiving a reaction force from the mounting tool 16, to release the reaction force. This vertical movement then causes the contact member 48 to be pressed against the pressure receiving plate 52 and the reaction force to be transmitted to the pressure receiving plate 52.

With the arrangement above, it is possible to prevent the mounting tool 16 from being inclined and the mounting accuracy from decreasing. That is, in this embodiment, when mounting a semiconductor chip on the substrate 100, the semiconductor chip, which is set on the relay stage 14, is picked up with the mounting tool 16 and moved to a position over the substrate 100. This movement is achieved by moving the X-axis movable base 32 along the X-axis guide rails 30 and moving the Y-axis movable base 36 along the Y-axis guide rail 34. When the mounting tool 16 is located immediately above a mounting position on the substrate 100, the pressurizing mechanism 20 is then driven to move down the mounting tool 16 toward the substrate 100 and press the semiconductor chip against the surface of the substrate 100. Upon this, the mounting tool 16 experiences a reaction force of a magnitude according to the pressing load. The reaction force experienced with the mounting tool is transmitted to the pressurizing mechanism 20. However, the pressurizing mechanism 20, which is attached in a vertically displaceable manner as mentioned above, is displaced vertically upward upon receiving the reaction force. As a result of the displacement, the contact member 48 comes into contact with the pressure receiving plate 52, so that the pressure receiving plate 52 receives the reaction force. Since the pressure receiving plate 52 is a member provided independently of the mounting tool 16 and the pressurizing mechanism 20, no moment occurs on the pressurizing mechanism 20 or the mounting tool 16, even if the pressure receiving plate 52 receives the reaction force, and they are prevented from being inclined. As a result, it is possible to prevent the mounting accuracy from decreasing.

Also, in this embodiment, the pressurizing mechanism 20 is arranged to move together with the mounting tool 16 in the horizontal direction, and the pressure receiving member 22 is located over the entire movable range of the pressurizing mechanism 20. It is therefore possible to prevent the mounting tool 16 from being inclined due to the reaction force while also being pressed onto the substrate 100 anywhere within the horizontal movable range of the mounting tool 16. As a result, there is no need to provide a horizontal moving mechanism for the substrate 100, which allows for reduction in the size and/or cost of the entire apparatus.

Figure 3:
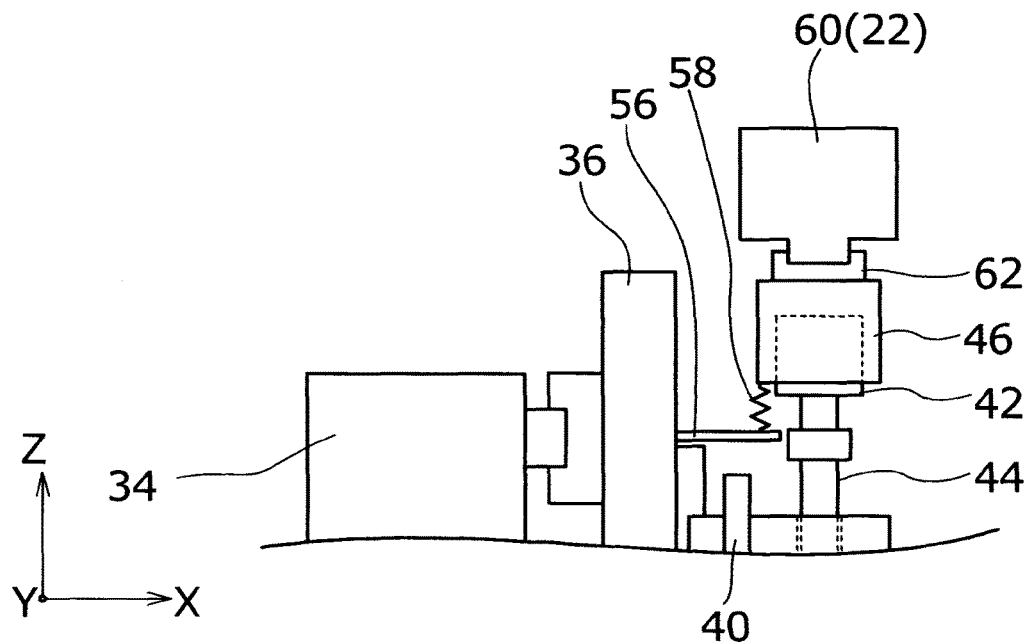
FIG. 3 is a schematic side view around another mounting head.

It is noted that the above-described arrangement is merely an example and, provided that the pressurizing mechanism 20 is movable together with the mounting head 12 in the horizontal direction and that the pressure receiving member 22 is provided, which is installed in proximity to the pressurizing mechanism 20 to receive the reaction force from the pressurizing mechanism 20, the other configurations can be changed appropriately. For example, although in this embodiment, the pressurizing mechanism 20 is attached to the Y-axis movable base 36 via the box-shaped elastic body 54 with the left and right side plates bored into an approximately rectangular shape, the pressurizing mechanism 20 can be held with another configuration as long as held against the force of gravity and vertically movable upon receiving a reaction force. For example, as shown in FIG. 3, a vertically stretchable coil spring 58 can be arranged between an angle 56 fixed to the Y-axis movable base 36 and a bottom portion of the motor holder 46, and the coil spring 58 can be used to support the pressurizing mechanism 20.

Figure 4:
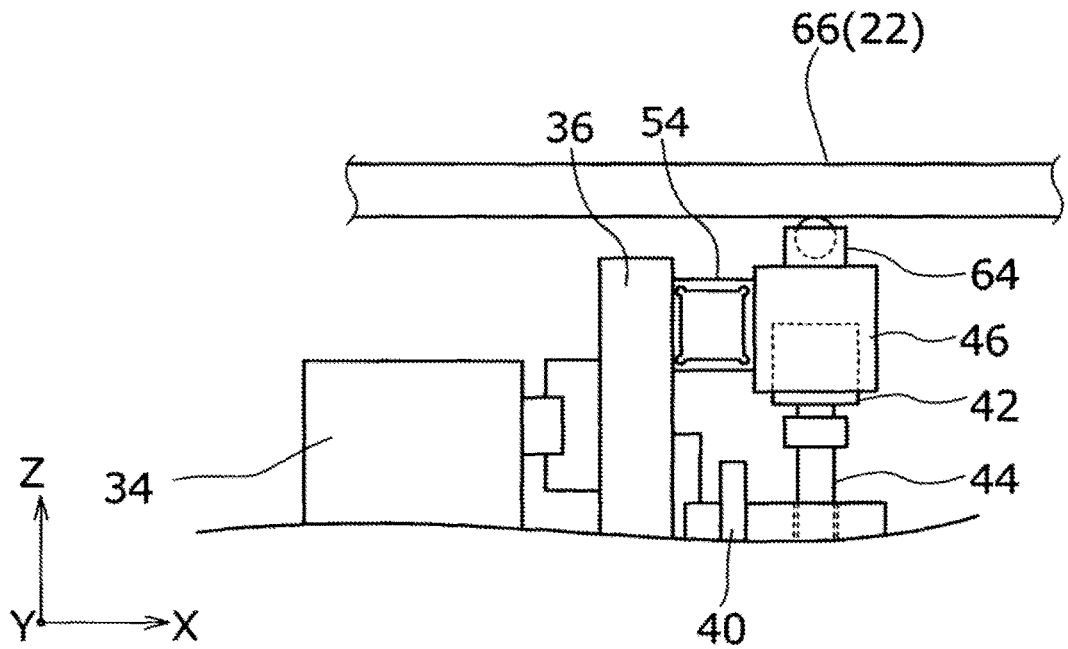
FIG. 4 is a schematic side view around a further mounting head.

Although in this embodiment, the contact member 48 having an arc-shaped leading end is arranged to come into contact with the bottom surface of the pressure receiving plate 52 to slide, another configuration can be employed as long as the pressurizing mechanism 20 is slidable with respect to the pressure receiving member 22. For example, as shown in FIG. 3, the pressure receiving member 22 can be provided with a rail 60 extending in the Y-axis direction on the bottom surface and a slide block 62 arranged to engage with the rail 60 to slide on the top surface of the motor holder 46, so that the pressurizing mechanism 20 is slidable with respect to the pressure receiving member 22. Also, as another mode, a ball roller 64 can be arranged on the top surface of the motor holder 46, as shown in FIG. 4.

Further, although in this embodiment, the pressure receiving member 22 is installed on the Y-axis guide rail 34 as well as the X-axis movable base 32 to be movable in the X-axis direction, the pressure receiving member 22 may not be movable in the horizontal direction as long as capable of covering the movable range of the pressurizing mechanism 20. For example, as shown in FIG. 4, the pressure receiving member 22 can be a positionally fixed flat plate 66 having a size that covers the movable ranges in the X-axis and Y-axis directions of the pressurizing mechanism.

Although the flip-chip mounting apparatus 10 is used as an example in the description above, the technique of this embodiment can be applied to another type of apparatus such as, for example, a die-bonding apparatus as long as the apparatus is arranged to press and mount an electronic component onto the surface of a substrate 100.

The present invention is not intended to be limited to the above-described embodiment, but to include all variations and modifications without departing from the technical scope and sprit of the present invention as defined in the appended claims.

REFERENCE SIGNS LIST

10 Mounting apparatus
12 Mounting head
14 Relay stage
16 Mounting tool
18 Substrate stage
20 Pressurizing mechanism
22 Pressure receiving member
24 Camera
26 Movable block
28 Transport mechanism
30 X-axis guide rail
32 X-axis movable base
34 Y-axis guide rail
36 Y-axis movable base
38 Z-axis guide rail
40 Z-axis movable base
42 Z-axis motor
44 Lead screw
46 Motor holder
48 Contact member
50 Column
52 Pressure receiving plate
54 Elastic body
56 Angle
58 Coil spring
60 Rail
62 Slide block
64 Ball roller
66 Flat plate
100 Substrate

The invention claimed is:

1. A mounting apparatus for mounting an electronic component on a substrate, the apparatus comprising:
    a first movable base movable in a first direction;
    a second movable base attached to the first movable base and movable in a second direction orthogonal to the first direction;
    a mounting head attached to the second movable base and including a mounting tool for sucking and holding the electronic component;
    a pressurizing mechanism attached to the first movable base and arranged to apply a force in the second direction to the mounting head,
    wherein the pressurizing member comprises a contact member having a top surface; and
    a pressure receiving member provided independently of the first movable base and the second movable base and installed in proximity to the pressurizing mechanism,
    wherein the pressurizing receiving member comprises a receiving plate having a bottom surface,
    wherein the top surface of the contact member is slidable on the bottom surface of the receiving plate, and
    wherein the receiving plate positioned directly above the contact member for directly countering a reaction force in the second direction from the pressurizing mechanism.

2. The mounting apparatus according to claim 1, wherein the pressurizing mechanism is attached to the first movable base in a manner allowed to move in the second direction while held against the force of gravity.

3. The mounting apparatus according to claim 2, wherein the pressurizing mechanism is attached to the first movable base via an elastic body flexible in the second direction upon receipt of a reaction force while holding the pressurizing mechanism against the force of gravity.

4. The mounting apparatus according to claim 1, wherein the bottom surface of the receiving plate has a size that entirely covers a movable range of the second movable base.

5. The mounting apparatus according to claim 1, wherein the first movable base is arranged to move along a first rail extending in the first direction, wherein
the receiving plate extends parallel to the first rail, and
wherein the first rail and the pressure receiving member are attached to a third movable base movable in a third direction orthogonal to the first direction and the second direction.

6. A mounting apparatus for mounting an electronic component on a substrate, the apparatus comprising:
a first movable base movable in a specified first direction;
a second movable base attached to the first movable base and movable in a second direction orthogonal to the first direction;
a mounting head attached to the second movable base including a mounting tool for sucking and holding the electronic component;
a pressurizing mechanism attached to the first movable base via
an elastic body and arranged to apply a force in the second direction to the mounting head; and
a pressure receiving member provided independently of the first movable base and the second movable base and installed in proximity to the pressurizing mechanism to receive a reaction force in the second direction from the pressurizing mechanism, the pressurizing mechanism slidable on the pressure receiving member,
wherein the pressurizing mechanism does not move in a vertical direction with the mounting head, and
wherein the elastic body holds the pressurizing mechanism against gravity without holding the mounting head and allows upward directional movement of the pressing mechanism in the vertical direction by deflecting in the vertical direction with receiving the reaction force.

* * * * *